United States Patent
Priel et al.

(10) Patent No.: US 9,092,163 B2
(45) Date of Patent: Jul. 28, 2015

(54) METHOD, INTEGRATED CIRCUIT AND ELECTRONIC DEVICE FOR COMPENSATING A TIMING SIGNAL BASED AT LEAST PARTLY ON DETERMINING A NUMBER OF STATE TRANSITIONS BETWEEN A CURRENT SET OF DATA STATES AND THE NEXT SET OF DATA STATES

(75) Inventors: Michael Priel, Hertzelia (IL); Leonid Fleshel, Hertzelia (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 475 days.

(21) Appl. No.: 13/510,103

(22) PCT Filed: Nov. 30, 2009

(86) PCT No.: PCT/IB2009/055421
§ 371 (c)(1),
(2), (4) Date: May 16, 2012

(87) PCT Pub. No.: WO2011/064626
PCT Pub. Date: Jun. 3, 2011

(65) Prior Publication Data
US 2012/0239960 A1 Sep. 20, 2012

(51) Int. Cl.
*G06F 1/12* (2006.01)
*G06F 13/42* (2006.01)
*G11C 7/10* (2006.01)

(52) U.S. Cl.
CPC ............... *G06F 1/12* (2013.01); *G11C 7/1051* (2013.01); *G11C 7/1066* (2013.01)

(58) Field of Classification Search
CPC ........................................................ G06F 1/12
USPC ........................................................ 713/400
See application file for complete search history.

(56) References Cited

U.S. PATENT DOCUMENTS

| 5,742,798 | A | * | 4/1998 | Goldrian | ....................... 713/400 |
| 6,629,064 | B1 | | 9/2003 | Wall | |
| 6,735,128 | B2 | | 5/2004 | Kim | |
| 6,919,738 | B2 | | 7/2005 | Kushida | |
| 7,755,402 | B1 | * | 7/2010 | Ku et al. | ......................... 327/153 |
| 2001/0020286 | A1 | | 9/2001 | Hill et al. | |
| 2005/0041483 | A1 | | 2/2005 | Kim | |
| 2005/0068082 | A1 | * | 3/2005 | Nguyen et al. | ................. 327/277 |
| 2007/0057691 | A1 | | 3/2007 | Lee | |

OTHER PUBLICATIONS

International Search Report and Written Opinion correlating to PCT/IB2009/055421 dated Aug. 27, 2010.

* cited by examiner

*Primary Examiner* — Thomas Lee
*Assistant Examiner* — Robert Cassity

(57) ABSTRACT

A method for compensating a timing signal with which an outputting of data states of at least one data signal is synchronised. The method comprises receiving a current set of data states and a next set of data states, identifying state transitions between the current set of data states and the next set of data states determining an amount of compensation to apply to the timing signal based at least partly on the state transitions identified between the current set of data states and the next set of data states, and applying the determined amount of compensation to the timing signal such that the compensation applies to the outputting of the next set of data states.

18 Claims, 6 Drawing Sheets

METHOD, INTEGRATED CIRCUIT AND ELECTRONIC DEVICE FOR COMPENSATING A TIMING SIGNAL BASED AT LEAST PARTLY ON DETERMINING A NUMBER OF STATE TRANSITIONS BETWEEN A CURRENT SET OF DATA STATES AND THE NEXT SET OF DATA STATES

FIELD OF THE INVENTION

The field of this invention relates to a method for compensating a timing signal, an integrated circuit and an electronic device.

BACKGROUND OF THE INVENTION

In the field of digital signalling, the presence of noise on a voltage supply line can affect the timing of signal transitions (i.e. transitions from a 'low' or '0' state to a 'high' or '1' state and vice versa), thereby advancing or delaying such transitions relative to an intended or expected timing position.

FIG. 1 illustrates an example of a typical interface driver 100 for transmitting digital signals across a plurality of signal lines. The interface driver 100 is arranged to receive a clock signal (Clk) 110. The interface driver 100 transmits the clock signal 110 as a data strobe signal (referred to as a DQS signal in terms of dual data rate (DDR) technology) 115, which is used at a receiving interface (not shown) as a timing reference signal with reference to which data signals are sampled. For example, in a case of a dual data rate (DDR) interface, whereby data signals are transmitted on rising and falling edges of a timing signal, a receiving interface samples data signals after a calibrated delay following each rising and falling edge of such a timing reference signal. Such a calibrated delay may comprise a duration equal to, say, a quarter cycle of the DQS signal 115 (which for the illustrated example equals a quarter cycle of the clock signal 110). The interface driver 100 is further arranged to provide the clock signal 110 to output latches 120, each output latch 120 being arranged to receive one of a set of data states 130 to be output, and upon receipt of a rising or falling edge of the received clock signal to output the received data states 130 as a set of data signals 140.

For high speed interfaces, such as by way of example a double data rate (DDR) interface that is typically used for providing an interface for synchronous dynamic random access memory (SDRAM), the high data rate means that the interval between rising and falling edges of the timing signal, and thus the interval within which a receiving interface has to sample a set data signals, is very short. Consequently, in order to ensure that a receiving interface has sufficient time to sample a current set of transmitted data signals before they are overwritten by a subsequently transmitted set of data signals, it is known for the interface driver 100 to delay (relative to the rising or falling edges of the received clock signal) the transition between successive data states of data signals being transmitted. The delayed transitions may be applied a short time before they are due to be sampled by a receiving interface. In this manner, the overwriting of a set of data signals by the next set of data signals is delayed for as long as possible, in order to provide the receiving interface with as much time as possible to sample the data signals. In this manner, a highest possible data rate may be achieved. Accordingly, the interface driver 100 of FIG. 1 is arranged to provide the clock signal 110 to the output latches 120 via a delay circuit 160, which for the illustrated example comprises a plurality of delay elements connected in series. In this manner, the output latches 120 receive a delayed version 150 of the clock signal 110.

FIG. 2 illustrates an example of a timing diagram 200 for the interface driver 100 of FIG. 1. The clock signal 110 of FIG. 1 is illustrated first, with one clock cycle thereof being illustrated generally at 215. A delayed clock signal 150 provided by the delay circuit 160 of FIG. 1 is illustrated, the delayed clock signal 150 comprising a delay that is relative to the clock signal 150 of approximately a quarter cycle, as illustrated generally at 250. The timings at which transitions for sequential sets of transmitted data signals are completed are illustrated generally at 220. As can be seen, there is a delay, illustrated generally at 225, between the rising and falling edges of the delayed clock signal 150, provided to the output latches 120 and thereby the completion of the transitions. Such a delay 225 is a result of a time period that is required to drive a transition from one state to another, and for the data signal to subsequently settle following such a transition. Accordingly, such a delay 225 is required to be taken into consideration when designing the delay circuit 160, in order to ensure the transitions are completed before a receiving interface attempts to sample the data signals 140 of FIG. 1. The time taken for driving a transition from one state to another, and thus the delay 225 in completing a transition, is affected by noise on the voltage supply lines of the interface driver 100. Thus, noise on the supply lines is also required to be taken into consideration when implementing the delay circuit 160.

For high speed interfaces such as DDR SDRAM interfaces, where a large number of signal lines are required to be driven at high data rates, noise on the supply lines and the delays to transitions caused thereby is particularly problematic. Due to the high transition rates and speeds of such interfaces, parasitics of integrated circuit devices in which the interface drivers are implemented have a significant effect on the delay of signal transitions caused by noise on the supply lines. Furthermore, the number of transitions occurring simultaneously affects the strain put on the supply lines, and thus the amount of noise on the supply lines. Accordingly, the number of transitions occurring simultaneously further impacts the delay of signal transitions. In addition to the number of transitions affecting the noise on the supply lines, the direction and symmetry of transitions occurring simultaneously (i.e. the balance between transitions from a 'high' state to a 'low' state and transitions from a 'low' state to a 'high' state) also affects the noise on supply lines.

Furthermore, with the continued desire for lower power consumption within electronic devices, supply voltages are required to be lower, making them more susceptible to noise, whilst driver impedances are required to be higher, increasing the strain applied to the supply lines when driving transitions. For example, the specifications for the DDR3 (double data rate three) SDRAM interface specify a 1.5v supply voltage, whilst providing a 34 Ohm driver impedance. Such strict constraints applied to the driver circuit for such high speed interfaces mean that the problem of noise on the supply lines has become an even greater problem.

As the number and direction of transitions that occur simultaneously may vary significantly, the amount of supply noise caused by such transitions, and the consequential delays in such transitions completing, may also vary significantly. Consequently, in order to ensure transitions of data signals are completed before the data signals are sampled by a receiving interface, it is necessary for the delay circuit 160 of FIG. 1 to be configured such that the transitions are initiated early enough for, say, a worst case scenario. Whilst this may help to ensure transitions of data signals are completed before the data signals are sampled by a receiving interface, for the vast majority of the time transitions are initiated much sooner than actually required. As a result, the amount of time available for a receiving interface to sample a current set of transmitted data signals before they are overwritten by a subsequently transmitted set of data signals is unnecessarily reduced, thereby increasing the risk of data being overwritten before it has been sampled by the receiving interface.

A simple option for reducing the noise introduced on to supply lines, and thus the effect such noise has on the delay of signal transitions, is to reduce the parasitic inductance on supply input/output (I/O) pads of the integrated circuit devices which the interface drivers are implemented.

One way of reducing such parasitic inductance on the supply I/O pads is to use flip chip, also known as Controlled Collapse Chip Connection (C4), semiconductor devices. Such devices use solder bumps deposited on chip pads located on an upper surface of the wafer during the final wafer processing step. The 'chips' are then mounted by being flipped over with the solder bumps being aligned within matching pads on the external circuit. The solder is then 'flowed' to form an electromechanical connection. This is in contrast to the more traditional method of using wire bonding whereby the chip is mounted upright and wires are used to interconnect the chip pads to external circuit. In this manner, the inductive properties of the wire bonds are removed from the flip chip pads. However, flip chips suffer from several disadvantages. For example, flip chips require a very flat surface to be mounted on, which is not always easy to guarantee, and often difficult to maintain, as boards onto which they are mounted heat and cool. Furthermore, the short connections are very stiff, so thermal expansion of the chip must be matched to the supporting board in order to avoid the connections breaking. As a result, the use of flip chips is expensive, and, in some applications, not practical.

Another way of reducing parasitic inductance on the supply I/O pads is to increase the number of supply I/O pads. However, due to the high functionality of modern system on chips (SoCs), and the limited availability of I/O pads, this is either impractical, or impossible.

SUMMARY OF THE INVENTION

The present invention provides a method for compensating a timing signal, an integrated circuit and an electronic device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described in terms of an interface driver, such as may be implemented as part of a double data rate synchronous dynamic random access memory (DDR SDRAM) interface. However, the present invention is not limited to such an implementation, and it is envisaged that the present invention may be implemented within any arrangement whereby compensation may be applied to a timing signal with which an outputting of data states of at least one data signal are synchronised.

Furthermore, because the illustrated examples of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 3:
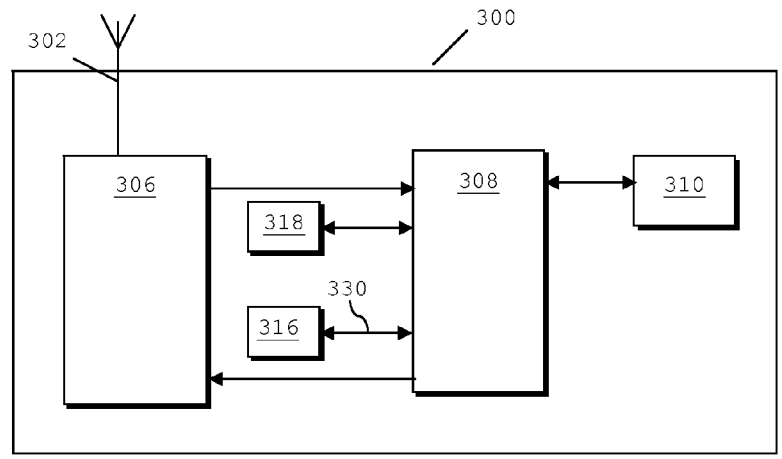
FIG. 3 illustrates an example of a simplified block diagram of part of an electronic device.

Referring now to FIG. 3, there is illustrated an example of a simplified block diagram of part of an electronic device, which for the illustrated example comprises a communication unit 300 adapted to support the inventive concept of an example of the present invention. The communication unit 300, in the context of the illustrated example, is a mobile telephone handset. As such, the communication unit 300 comprises an antenna 302 and contains a variety of well known radio frequency components or circuits 306, operably coupled to the antenna 302 that will not be described further herein. The communication unit 300 further comprises signal processing module 308. An output from the signal processing module 308 is provided to a suitable user interface (UI) 310 comprising, for example, a display, keypad, microphone, speaker, etc.

The signal processing module 308 is coupled to a memory element 316 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 318 is typically coupled to the signal processing module 308 to control the timing of operations within the communication unit 300.

Modern electronic devices, such as the communication unit 300 of FIG. 3, often require various high speed data paths in order to be able transmit electronic signals between various components therein at required high data rates. For example, it is typical for a signal processor, such as signal processing module 308, to be provided within a first integrated circuit device, whilst a memory element, such as memory element 316, is provided within a second integrated circuit device. Communication between the signal processing module 308 and the memory element 316 is typically realised by way of high data rate signals, for example in a form of an interface that comprises a data/address bus or the like, illustrated generally at 330. For example, in a case where the memory element 316 comprises synchronous dynamic read only memory (SDRAM), the interface 330 may comprise a dual data rate (DDR) SDRAM interface conforming to one of the JEDEC DDR SDRAM interface standards, such as the DDR3 SDRAM interface, details of which may be obtained from www.jedec.orq.

Figure 4:
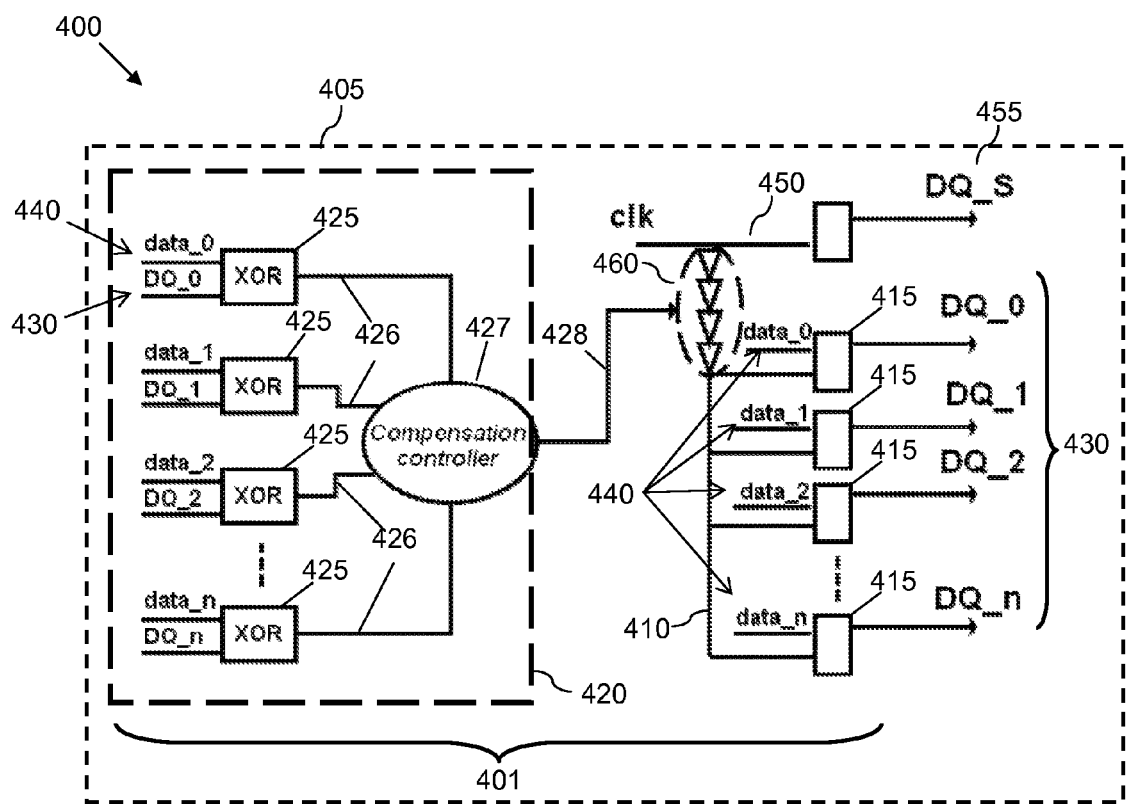
FIG. 4 illustrates an example of a simplified block diagram of part of an interface driver.

Referring now to FIG. 4, there is illustrated an example of a simplified block diagram of part of an interface driver 400 for transmitting data signals across an interface, such as the interface 330 between the signal processing module 308 and the memory element 316 of FIG. 3. For the illustrated example, the interface driver 400 forms a part of an integrated circuit device 405. The interface driver 400 is arranged to receive a clock signal (Clk) 450. The interface driver 400 transmits the clock signal as a strobe signal (DQS) 455, which is used by a receiving interface (not shown) as a timing reference signal with reference to which data signals output by the interface driver 400 are sampled. For clarity, the terms 'data' and 'data signal' used herein are not intended to be limited to only signals used for relaying data, but rather they are intended to incorporate any signal in which information is relayed, such as an address signal, control signal, a flag signal, etc.

The interface driver 400 further comprises timing circuit 401 for generating a timing signal 410 with which an outputting of data states of at least one data signal is synchronised. More specifically, for the illustrated example, the timing signal 410 is provided to output latches 415, each output latch 415 being arranged to receive one of a set of data states corresponding to a set of data signals to be output by the interface driver 400, and to output the received data state in accordance with the received timing signal 410. For example, in a case where the interface driver 400 forms a part of a dual data rate (DDR) interface, the output latches 415 may be arranged to output the received data states 440 upon each rising and falling edge of the timing signal 410. Accordingly, for the illustrated example, each output latch 415 is arranged to output a data state of a current set of data states 430. A data state of a next set of data states 440 is provided to an input of each output latch 415, and upon receipt of a subsequent rising or falling edge of the timing signal 410, the output latches 415 are arranged to output the next set of data states 440 provided to their inputs, which subsequently become the current set of data states 430. In this manner, the outputting of the data states is substantially synchronised with the timing signal 410. The next set of data states 440 may then be updated with a succeeding set of data states in a sequence of data state sets to be output. For example, the updating of the next set of data states 440 may be substantially synchronised to the clock signal (Clk) 450.

In one example, the timing circuit 401 comprises compensation circuit 420 arranged to receive the current set of data states 430 and the next set of data states 440, in order to identify state transitions between the current set of data states 430 and the next set of data states 440. The compensation circuit 420 further determines an amount of compensation to apply to the timing signal 410, based at least partly on the state transitions identified between the current set of data states 430 and the next set of data states 440.

For example, each data state may comprise one of a number of states, and typically may comprise one of two states: a 'high' state, which may alternatively be referred to as a '1' or 'TRUE' state; and a 'low' state, which may alternatively be referred to as a '0', '−1' or 'FALSE' state. Accordingly, for each sequence of data states corresponding to a data signal, the compensation circuit 420 is arranged to detect when a transition from one state to another occurs. For the example illustrated in FIG. 4, the compensation circuit 420 comprises exclusive OR (XOR) logic gates 425, each XOR gate 425 corresponding to a data signal output by the interface driver 400 and arranged to receive a current data state 430 and a next data state 440 for the respective data signal. Accordingly, each XOR gate 425 outputs a 'TRUE' signal when the respective current data state 430 and next data state 440 are different (i.e. when a state transition will occur between the current data state 430 and the next data state 440). Conversely, each XOR gate 425 outputs a 'FALSE' signal when the respective current data state 430 and next data state 440 are the same (i.e. when a state transition will not occur between the current data state 430 and the next data state 440). In this manner, the XOR gates 425 identify state transitions between the current set of data states 430 and the next set of data states 440.

The timing circuit 401 for the illustrated example further comprises compensation controller 427. The compensation controller 427 is operably coupled to outputs 426 of XOR gates 425 and, as such, is arranged to receive the signals output by the XOR gates 425 identifying state transitions between the current set of data states 430 and the next set of data states 440. The compensation controller 427 determines an amount of compensation to apply to the timing signal 410 based at least partly on the state transitions identified by the XOR gates 425.

Figure 5:
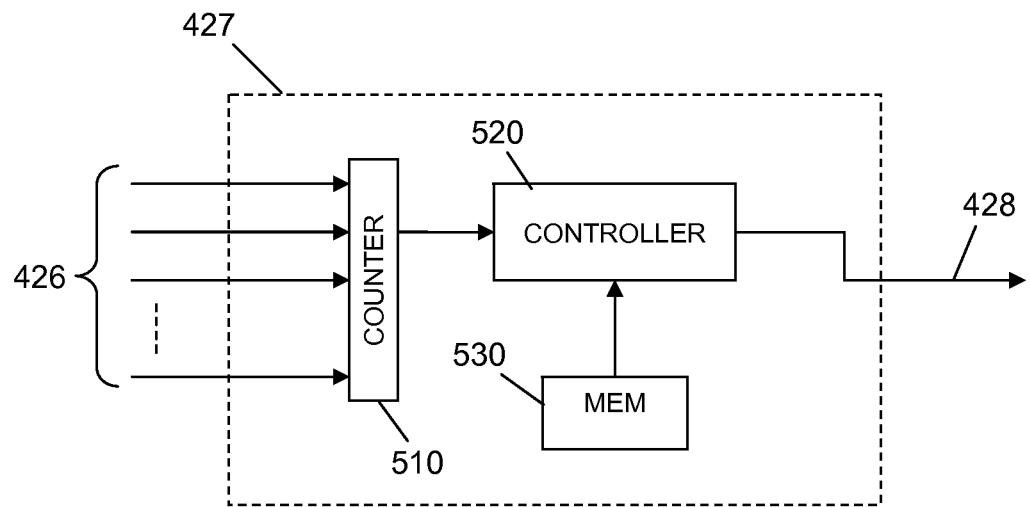
FIG. 5 illustrates an example of a simplified block diagram of a compensation controller.

FIG. 5 illustrates an example of a simplified block diagram of compensation controller 427. For the illustrated example, the compensation controller 427 comprises a counter 510 arranged to receive the signals output by the XOR gates 425 that identify state transitions between the current set of data states 430 and the next set of data states 440, and to count the number of transitions identified. The compensation controller 427 further comprises a controller 520 arranged to receive an indication of the number of transitions identified from the counter 510, and to determine an amount of compensation to apply to the timing signal 410. In particular for the illustrated example, the controller 520 is operably coupled to a memory element 530, and is arranged to look up, for example within a lookup table stored within the memory element 530, an amount of compensation to apply based on the number of state transitions identified between the current set of data states 430 and the next set of data states 440. For example, Table 1 below illustrates a simplified example of such a lookup table.

TABLE 1

Compensation Lookup Table

| No. of Transitions Identified | Amount of Compensation |
|---|---|
| 0 | −1 |
| 1 | −1 |
| 2 | 0 |
| 3 | 0 |
| 4 | +1 |
| ... | ... |

Alternatively, the controller 520 may be arranged to determine an amount of compensation to apply based on inputting the number of state transitions identified in an algorithm.

Having determined the amount of compensation to apply to the timing signal 410, the controller 520 outputs, via control compensation control signal 428, an indication of the amount of compensation to be applied to the timing signal 410.

Referring back to FIG. 4, the timing circuit 401 further comprises delay circuit 460 arranged to receive a reference timing signal, which for the illustrated example comprises clock signal 450. The delay circuit 460 applies a delay to the received reference timing signal in order to generate the timing signal 410 with which the outputting of data states is synchronised. The delay circuit 460 is further arranged to receive the compensation control signal 428 and to apply a delay to the received reference timing signal in accordance with the indication of the amount of compensation to be applied to the timing signal.

Figure 6:
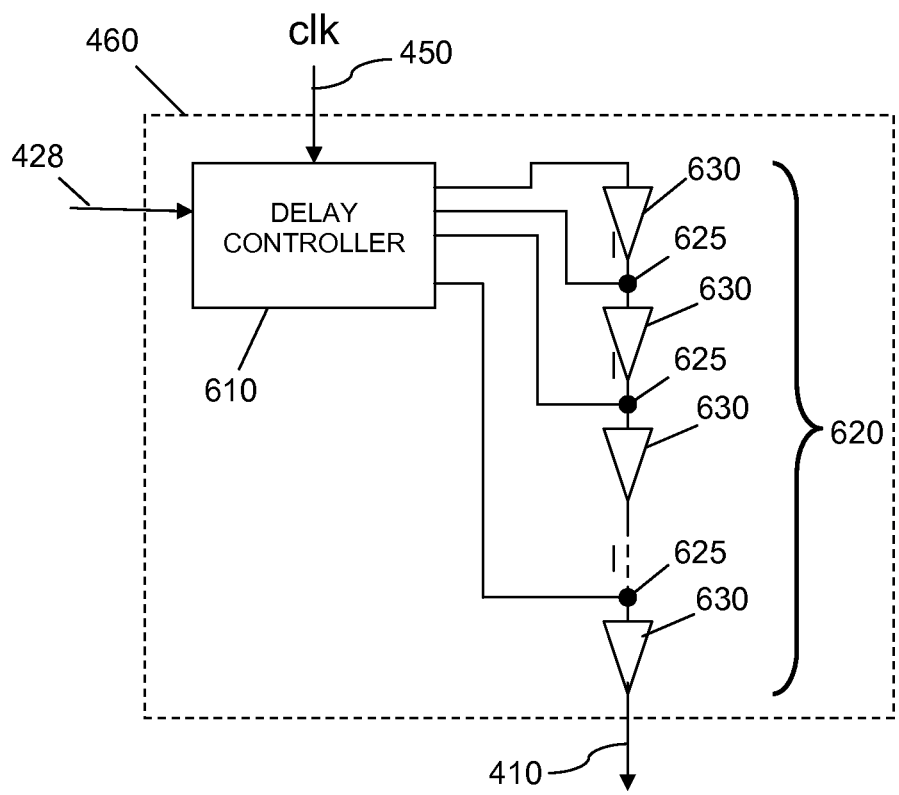
FIG. 6 illustrates an example of a simplified block diagram of a delay circuit.

FIG. 6 illustrates an example of a simplified block diagram of delay circuit 460. The delay circuit 460 comprises delay controller 610 arranged to receive the compensation control signal 428 from the compensation controller, say compensation controller 427 of FIG. 5, and the reference timing signal 450. The delay circuit 460 further comprises a delay line 620 comprising a plurality of delay elements 630 operably coupled in series, and from a 'downstream' end of which the timing signal 410 is produced. The delay controller 610 is operably coupled to a plurality of nodes 625 along the delay line 620 is arranged to apply the reference signal 450 to one of the nodes 625 in accordance with the compensation control signal 428. The delay elements 630 impart a delay to the reference timing signal 450 to produce the timing signal 410, with the overall delay that is imparted being dependent upon the number of delay elements 630 through which the reference timing signal 450 passes. In this manner, the compensation controller 427 is able to apply a determined amount of compensation to the timing signal 410 by indicating to the delay controller 610 which node 625 to apply the reference signal 450 by way of the compensation control signal 428, and thereby configuring the delay imparted to the reference signal 450 to produce the timing signal 410.

Figure 1:
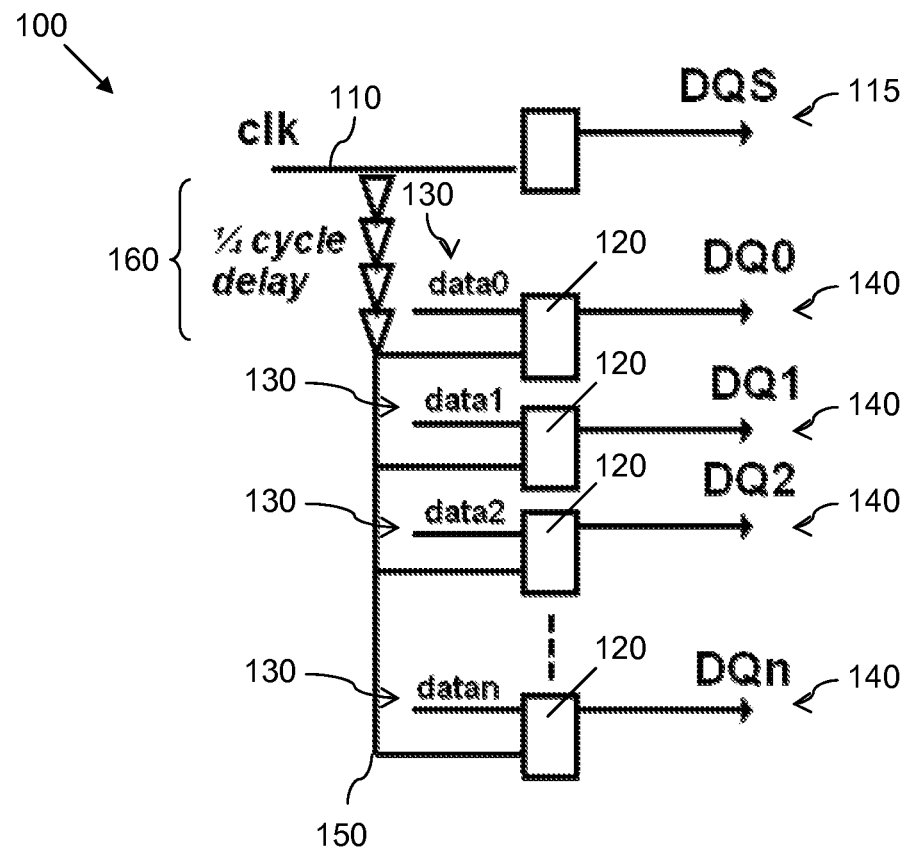
FIG. 1 illustrates an example of a typical interface driver.
Figure 2:
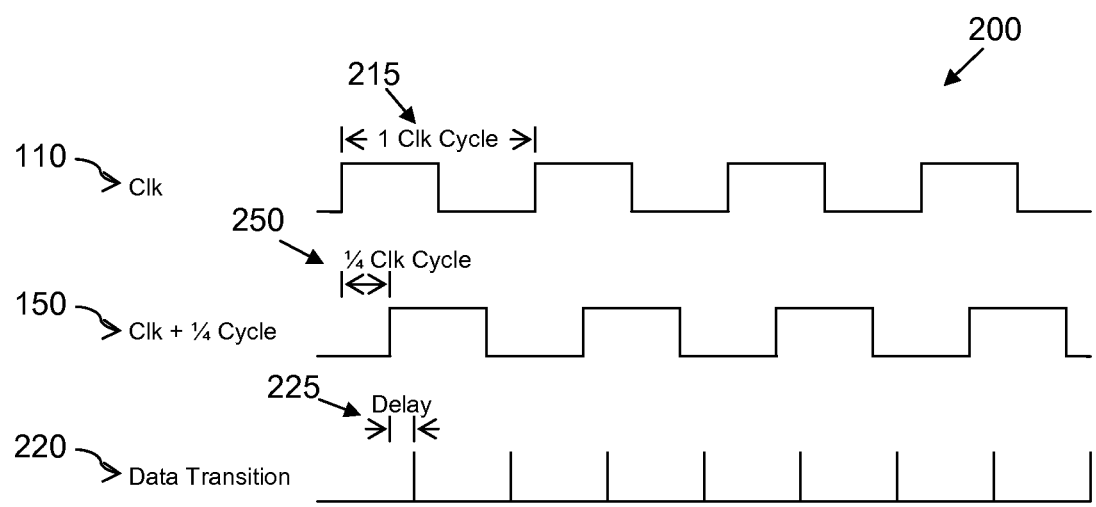
FIG. 2 illustrates an example of a timing diagram for the interface driver of FIG. 1.

Due to the high transition rates and speeds of modern data interfaces, parasitics of integrated circuit devices in which the interface drivers are implemented have a significant effect on the delay of signal transitions caused by noise on the supply lines. In particular, the number of transitions occurring simultaneously affects the strain put on the supply lines, and thus the amount of noise on the supply lines and thereby the delay of the signal transitions being completed. However, for the timing circuit 401 of FIG. 4, the compensation circuit 420 is able to identify state transitions between the current set of data states 430 and the next set of data states 440. The compensation circuit is further able to determine an amount of compensation to apply to the delay imparted to the timing signal 410 by delay circuit 460 in order to compensate for unwanted delays in transitioning from a current state 430 to a next state 440 caused by such noise on supply lines. In this manner, the overall compensated delay in transitioning from a current state 430 to a next state 440, relative to the strobe signal 455, may be compensated for in order to provide a substantially constant delay, irrespective of the number of state transitions between the current set of data states 430 and the next set of data states 440. As such, the overall delay is significantly more predictable than that for the driver interface 100 of the prior art illustrated in FIG. 1, and may therefore be configured more optimally, thereby increasing the amount of time available for a receiving interface to sample a current set of transmitted data signals before they are overwritten by a subsequently transmitted set of data signals, and thereby enabling a higher data rate to be achieved.

Furthermore, since unwanted delays in transitioning from a current state 430 to a next state 440 caused by such noise on supply lines may be substantially compensated for, the need for reducing such noise onto the supply lines is reduced. Accordingly, the need to reduce the parasitic inductance, etc., in order to reduce the noise on the supply lines, is also reduced, thereby allowing the use of less expensive integrated circuit packaging.

Figure 7:
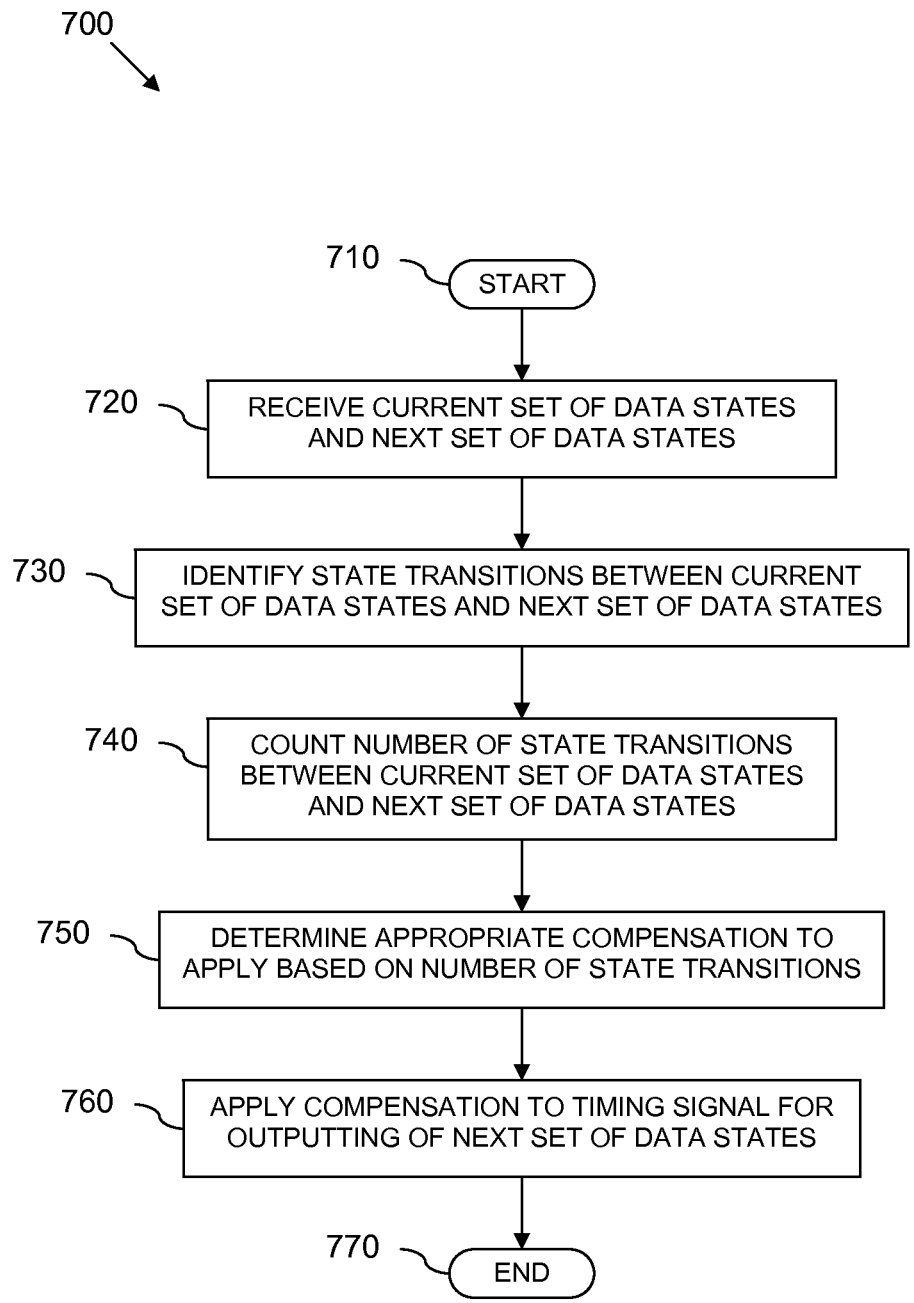
FIG. 7 illustrates an example of a simplified flowchart of a method for compensating a timing signal.

Referring now to FIG. 7, there is illustrated an example of a simplified flowchart 700 of a method for compensating a timing signal with which an outputting of data states of at least one data signal is synchronised, such as may be implemented by the interface driver 400 of FIG. 4. The method starts at step 710 and moves on to step 720 with a receipt of a current set of data states and a next set of data states. Next, in step 730, state transitions between the current set of data states and the next set of data states are identified, and the number of identified state transitions between the current set of data states and the next set of data states is then counted in step 740. The method then moves on to step 750, where an appropriate amount of compensation to be applied is determined based at least on the number of state transitions, for example using a lookup table stored in memory. The determined amount of compensation is then applied to a timing signal with which an outputting of data states is synchronised, such that the compensation applies to the outputting of the next set of data states, in step 760, and the method ends at step 770.

Figure 8:
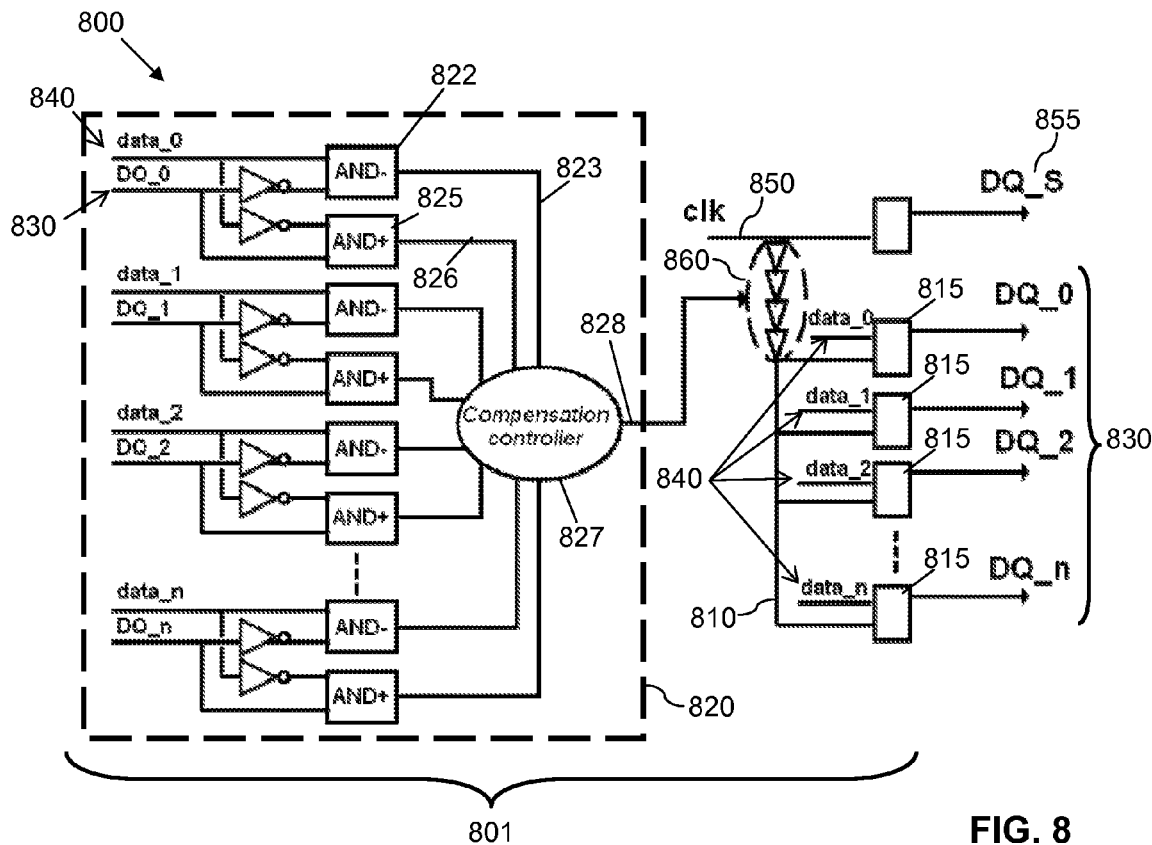
FIG. 8 illustrates an alternative example of a simplified block diagram of part of an interface driver.

Referring now to FIG. 8, there is illustrated an alternative example of a simplified block diagram of part of an interface driver 800 for transmitting data signals across an interface. In a similar manner to the interface driver 400 of FIG. 4, the interface driver 800 of FIG. 8 is arranged to receive a clock signal (Clk) 850, which the interface driver 800 transmits as a strobe signal (DQS) 455 used by a receiving interface (not shown) as a timing reference signal with reference to which data signals output by the interface driver 800 are sampled. Again, the terms 'data' and 'data signal' used herein are not intended to be limited to only signals used for relaying data, but rather are intended to incorporate any signal in which information is relayed, such as an address signal, control signal, a flag signal, etc.

The interface driver 800 further comprises timing circuit 801 for generating a timing signal 810 with which an outputting of data states of at least one data signal is synchronised. More specifically, for the illustrated example, the timing signal 810 is provided to output latches 815, each output latch 815 being arranged to receive one of a set of data states corresponding to a set of data signals to be output by the interface driver 800, and to output the received data state in accordance with the received timing signal 810. Accordingly, for the illustrated example each output latch 815 is arranged to output a data state of a current set of data states 830. A data state of a next set of data states 840 is provided to an input of each output latch 815, and upon receipt of a subsequent edge (rising or falling) of the timing signal 810, the output latches 815 are arranged to output the next set of data states 840 provided to their inputs, which subsequently become the current set of data sates 830. In this manner, the outputting of the data states is substantially synchronised with the timing signal 810. The next set of data states 840 may then be updated with a succeeding set of data states in a sequence of data state sets to be output. For example, the updating of the next set of data states 840 may be substantially synchronised to the clock signal (Clk) 450.

In one example, the timing circuit 801 comprises compensation circuit 820 arranged to receive the current set of data states 830 and the next set of data states 840, in order to identify state transitions between the current set of data states 830 and the next set of data states 840. the compensation circuit 820 further determines an amount of compensation to apply to the timing signal 810, based at least partly on the state transitions identified between the current set of data states 840 and the next set of data states 840.

For the example illustrated in FIG. 8, the compensation circuit 820 comprises a first set of AND logic gates 822 and a second set of AND logic gates 825. Each of the first set of AND logic gates 822 corresponds to a data signal output by the interface driver 800 and is arranged to receive a current data state 830 and an inverted next data state 840 for the respective data signal. In this manner, each of the first set of AND logic gates 822 outputs a 'TRUE' signal when the respective current data state 830 comprises a 'HIGH' state and the next data state 840 comprises a 'LOW' data state (i.e. when a 'step-down' transition will occur between the current data state 830 and the next data state 840), and a 'FALSE' signal otherwise. Conversely, each of the second set of AND logic gates 825 also corresponds to a data signal output by the interface driver 800. However, the second set of AND logic gates 825 is arranged to receive an inverted current data state 830 and a next data state 840 for the respective data signal. In this manner, each of the second set of AND logic gates 825 outputs a 'TRUE' signal when the respective current data state 830 comprises a 'LOW' state and the next data state 840 comprises a 'HIGH' data state (i.e. when a 'step-up' transition will occur between the current data state 830 and the next data state 840), and a 'FALSE' signal otherwise. In this manner the first set of AND gates 822 identify step-down state transitions between the current set of data states 830 and the next set of data states 840, whilst the second set of AND gates 825 identify step-up state transitions between the current set of data states 830 and the next set of data states 840.

The timing circuit 801 for the illustrated example further comprises compensation controller 827. The compensation controller 427 is operably coupled to outputs 823, 826 of AND gates 822, 825 respectively, and, as such, is arranged to receive signals output by the AND gates 822, 825 that identify step-down and step-up state transitions between the current set of data states 830 and the next set of data states 840, and to determine an amount of compensation to apply to the timing signal 810 based at least partly on the step-down and step-up state transitions identified by the AND gates 822, 824.

Figure 9:
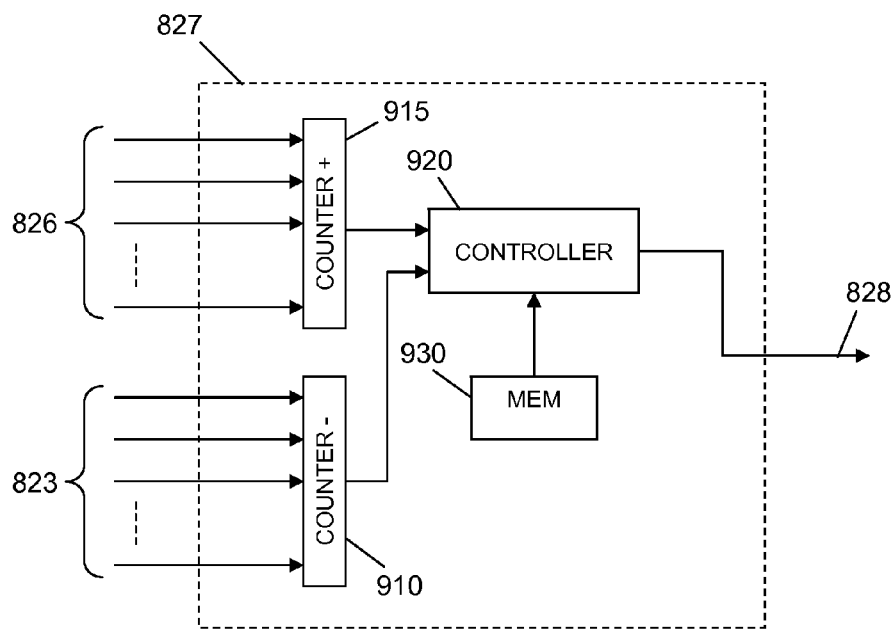
FIG. 9 illustrates an alternative example of a simplified block diagram of a compensation controller.

FIG. 9 illustrates an example of a simplified block diagram of compensation controller 827. For the illustrated example, the compensation controller 827 comprises a first counter 910 arranged to receive the signals output by the first set of AND gates 822 that identify step-down state transitions between the current set of data states 830 and the next set of data states 840, and to count the number of step-down transitions identified. The compensation controller 827 further comprises a second counter 915 arranged to receive the signals output by the second set of AND gates 825 identifying step-up state transitions between the current set of data states 830 and the next set of data states 840, and to count the number of step-up transitions identified. The compensation controller 827 still further comprises a controller 920 arranged to receive the number of step-down transitions identified from counter 910 and the number of step-up transitions identified from counter 915, and to determine an amount of compensation to apply to the timing signal 910. For example, the compensation controller 827 may be arranged to calculate a difference between the number of step-up transitions and the number of step-down transitions, and to look up, for example within a lookup table stored within memory element 930, an amount of compensation to apply based on the total number of transitions (i.e. the sum of the number of step-up transitions and the number of step-down transitions) as well as the difference between the number of step-up transitions and the number of step-down transitions. In this manner, the direction and symmetry of transitions occurring simultaneously (i.e. the balance between step-down transitions from a 'high' state to a 'low' state and step-up transitions from a 'low' state to a 'high' state) may be taken into consideration and compensated for.

Having determined the amount of compensation to apply to the timing signal 810, the controller 920 outputs, via control compensation signal 828, an indication of the amount of compensation to be applied to the timing signal 810.

Referring back to FIG. 8, the timing circuit 801 further comprises delay circuit 860 arranged to receive a reference timing signal, which for the illustrated example comprises clock signal 850. The delay circuit 860 applies a delay to the received reference timing signal in order to generate the timing signal 810 with which the outputting of data states is synchronised. The delay circuit 860 is further arranged to receive the compensation control signal 828 and to apply a delay to the received reference timing signal in accordance with the indication of the amount of compensation to be applied to the timing signal. The delay circuit 860 may comprise a delay circuit substantially corresponding to the delay circuit 460 illustrated in FIG. 6.

Figure 10:
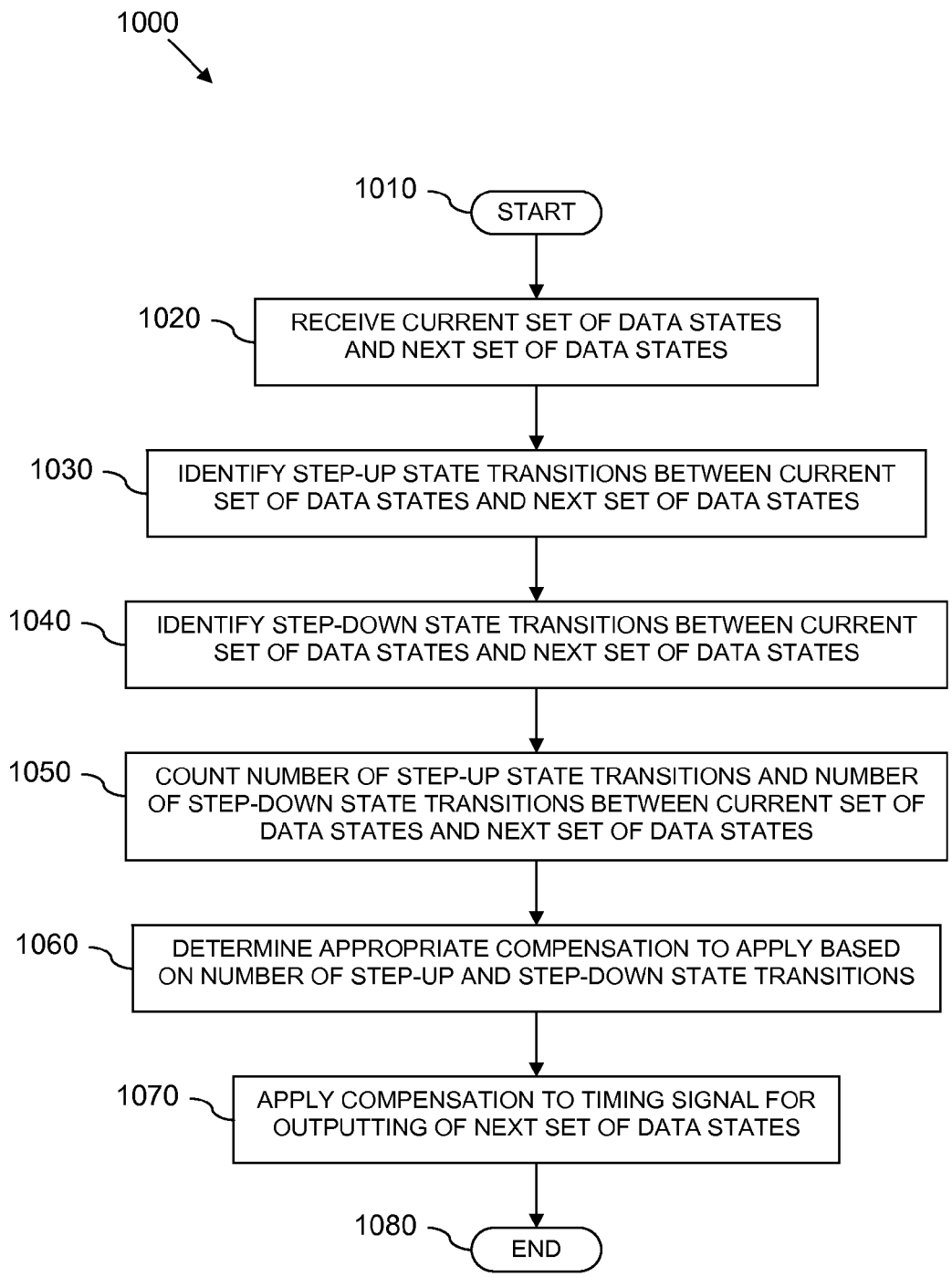
FIG. 10 illustrates an alternative example of a simplified flowchart of a method for compensating a timing signal.

Referring now to FIG. 10, there is illustrated an alternative example of a simplified flowchart 1000 of a method for compensating a timing signal with which an outputting of data states of at least one data signal is synchronised, such as may be implemented by the interface driver 800 of FIG. 8. The method starts at step 1010 and moves on to step 1020 with a receipt a current set of data states and a next set of data states. Next, in step 1030, step-up state transitions between the current set of data states and the next set of data states are identified, and step-down state transitions between the current set of data states and the next set of data states are identified in step 1040. The number of step-up state transitions and the number of step-down state transitions between the current set of data states and the next set of data states are then counted in step 1050. The method then moves on to step 1060, where an appropriate amount of compensation to be applied is determined based at least on the number of the number of step-up and step-down state transitions. The determined amount of compensation is then applied to a timing signal with which an outputting of data states is synchronised such that the compensation applies to the outputting of the next set of data states, in step 1070, and the method ends at step 1080.

Aspects of the invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

For example, for the illustrated examples described herein, the amount of compensation to apply has been determined based on a number of data transitions, and for the example illustrated in FIGS. 8 to 10 on a difference between the number of step-up transitions and the number of step-down transitions. However, in other examples, alternative characteristics of the state transitions may additionally or alternatively be used to determine the amount of compensation to apply. For example, a 'direction' of state transitions (e.g. whether the transitions are step-up or step-down transitions) may additionally be used to determine an amount of compensation to apply, whereby step-up and step-down transitions may be given different weightings respectively.

Furthermore, whilst for the illustrated example the delay circuitry 460, 860 is arrange to apply a delay to a timing signal with which the outputting of data states of all of the data signals is synchronised, in other examples the delay circuitry may be arranged to apply a delay to one or more timing signals with which the outputting of individual data signals or sub-sets of data signals are synchronised.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the logic gates for identifying state transitions, the compensation controller and delay circuit of each of the illustrated examples are illustrated as separate functional components. However, such function components may be integrated into a single functional component.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device, as illustrated in FIG. 4. Alternatively, the examples may be implemented as any number of separate integrated circuits or separate devices interconnected with each other in a suitable manner. For example, logic gates for identifying state transitions, the compensation controller may be implemented as circuitry located on an integrated circuit device discrete from an integrated circuit device on which the rest of the interface driver is located Also for example, the examples, or portions thereof, may implemented as soft or code representations of physical circuit or of logical representations convertible into physical circuit, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method comprising:
   receiving a current set of data states;
   outputting a next set of data states;
   identifying a number of state transitions between the current set of data states and the next set of data states;
   determining an amount of compensation to apply to a timing signal based at least partly on the number of the state transitions identified between the current set of data states and the next set of data states, wherein the outputting of the next set of data states is synchronized with the timing signal; and
   applying the determined amount of compensation to the timing signal such that the compensation applies to the outputting of the next set of data states.

2. The method of claim 1 wherein determining the amount of compensation to apply to the timing signal comprises looking up within a lookup from memory an amount of compensation to apply based on a number of state transitions between the current set of data states and the next set of data state.

3. The method of claim 1 further comprising:
   identifying step-up state transitions between the current set of data states and the next set of data states;
   identifying step-down state transitions between the current set of data states and the next set of data states;
   counting a number of step-up state transitions and a number of step-down state transitions between the current set of data states and the next set of data states; and
   determining the amount of compensation to apply to the timing signal based at least partly on the number of step-up state transitions and the number of step-down state transitions between the current set of data states and the next set of data states.

4. The method of claim 1 wherein said applying the determined amount of compensation to the timing signal comprises configuring a number of delay elements through which the timing signal is propagated in accordance with the determined amount of compensation to be applied.

5. The method of claim 1 wherein each next data state of the next set of data states is associated with a corresponding data signal of a double data rate (DDR) interface.

6. The method of claim 5 wherein each next data state of the next set of data states is associated with a corresponding data signal of a double data rate synchronised dynamic random access memory (DDR SDRAM) interface.

7. An integrated circuit device comprising:
   a timing circuit arranged to generate a timing signal with which an outputting of a next set of data states of at least one data signal is synchronized, wherein the timing circuit comprises a compensation circuit arranged to:
   receive a current set of data states and the next set of data states,
   identify a number of state transitions between the current set of data states and the next set of data states,
   determine an amount of compensation to apply to the timing signal based at least partly on the number of state transitions identified between the current set of data states and the next set of data states, and
   apply the determined amount of compensation to the timing signal such that the compensation applies to the outputting of the next set of data states.

8. The integrated circuit device of claim 7 further comprising an interface driver operably coupled to the timing circuit.

9. An electronic device comprising:
   a timing circuit arranged to generate a timing signal with which an outputting of a next set of data states of at least one data signal is synchronized, wherein the timing circuit comprises a compensation circuit arranged to:
   receive a current set of data states and the next set of data states,
   identify a number of state transitions between the current set of data states and the next set of data states,
   determine an amount of compensation to apply to the timing signal based at least part on the number of the state transitions identified between the current set of data states and the next set of data states, and
   apply the determined amount of compensation to the timing signal such that the compensation applies to the outputting of the next set of data states.

10. The integrated circuit device of claim 9 wherein the compensation circuit is further configured to determine the amount of compensation to apply to the timing signal by looking up within a lookup from memory an amount of compensation to apply based on a number of sate transitions between the current set of data states and the next set of data states.

11. The integrated circuit device of claim 7 wherein the compensation circuit is further configured to:
   identify step-up state transitions between the current set of data states and the next set of data states;
   identify step-down state transitions between the current set of data states and the next set of data states;
   count a number of step-up state transitions and a number of step-down state transitions between the current set of data states and the next set of data states; and
   determine the amount of compensation to apply to the timing signal based at least partly on the number of step-up state transitions and the number of step-down state transitions between the current set of data states and the next set of data states.

12. The electronic device of claim 9 wherein the compensation circuit is further configured to:
   count a number of state transitions between the current set of data states and the next set of data states; and
   determine the amount of compensation to apply to the timing signal based at least partly on the number of state transitions between the current set of data states and the next set of data states.

13. The electronic device of claim 12 wherein the compensation circuit is further configured to determine the amount of compensation to apply to the timing signal by looking up within a lookup from memory an amount of compensation to apply based on a number of state transitions between the current set of data states and the next set of data states.

14. The electronic device of claim 9 wherein the compensation circuit is further configured to:
   identify step-up state transitions between the current set of data states and the next set of data states;
   identify step-down state transitions between the current set of data states and the next set of data states;
   count a number of step-up state transitions and a number of step-down state transitions between the current set of data states and the next set of data states; and
   determine the amount of compensation to apply to the timing signal based at least partly on the number of step-up state transitions and the number of step-down state transitions between the current set of data states and the next set of data states.

15. The integrated circuit device of claim 7 wherein said applying the determined amount of compensation to the timing signal comprises configuring a number of delay elements through which the timing signal is propagated in accordance with the determined amount of compensation to be applied.

16. The integrated circuit device of claim 7 wherein each next data state of the next set of data states is associated with a corresponding data signal of a double data rate (DDR) interface.

17. The electronic device of claim 9 wherein said applying the determined amount of compensation to the timing signal comprises configuring a number of delay elements through which the timing signal is propagated in accordance with the determined amount of compensation to be applied.

18. The electronic device of claim 9 wherein each next data state of the next set of data states is associated with a corresponding data signal of a double data rate (DDR) interface.

* * * * *